US009030868B2

(12) United States Patent
Lee

(10) Patent No.: US 9,030,868 B2
(45) Date of Patent: May 12, 2015

(54) NONVOLATILE MEMORY DEVICE, METHOD FOR FABRICATING THE SAME, AND METHOD FOR OPERATING THE SAME

(71) Applicant: SK Hynix Inc., Gyeonggi-do (KR)

(72) Inventor: Nam-Jae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/149,467

(22) Filed: Jan. 7, 2014

(65) Prior Publication Data

US 2014/0117432 A1 May 1, 2014

Related U.S. Application Data

(62) Division of application No. 13/333,924, filed on Dec. 21, 2011, now Pat. No. 8,659,943.

(30) Foreign Application Priority Data

Mar. 4, 2011 (KR) ........................ 10-2011-0019511

(51) Int. Cl.

| | |
|---|---|
| *G11C 7/00* | (2006.01) |
| *H01L 29/788* | (2006.01) |
| *G11C 16/04* | (2006.01) |
| *G11C 16/10* | (2006.01) |
| *H01L 27/115* | (2006.01) |
| *H01L 29/66* | (2006.01) |

(52) U.S. Cl.

CPC .......... *H01L 29/788* (2013.01); *G11C 16/0483* (2013.01); *G11C 16/10* (2013.01); *H01L 27/11524* (2013.01); *H01L 29/66825* (2013.01)

(58) Field of Classification Search

CPC ........................................................ G11C 16/10
USPC .............................. 365/184, 185.05; 438/637
See application file for complete search history.

(56) References Cited

U.S. PATENT DOCUMENTS

| | | | | |
|---|---|---|---|---|
| 2009/0189211 | A1* | 7/2009 | Orimoto et al. | 257/319 |
| 2010/0289071 | A1* | 11/2010 | Jeon et al. | 257/321 |
| 2011/0020992 | A1* | 1/2011 | Purayath et al. | 438/259 |
| 2011/0230028 | A1* | 9/2011 | Wu et al. | 438/287 |
| 2011/0242899 | A1* | 10/2011 | Oowada et al. | 365/185.19 |

* cited by examiner

*Primary Examiner* — Michael Tran
(74) *Attorney, Agent, or Firm* — IP & T Group LLP

(57) ABSTRACT

A nonvolatile memory device includes bit and source lines alternately arranged parallel to each other and even strings and odd strings alternately arranged between the bit lines and the source lines and each including drain selection transistors, memory transistors, and a source selection transistor. The drain selection transistors include a first drain selection transistor with the same structure as the memory transistors and a second drain selection transistor with the same structure as the source selection transistor. The nonvolatile memory device further includes an even drain selection line connected to the first drain selection transistors of the even strings and the second drain selection transistors of the odd strings and an odd drain selection line connected to the second drain selection transistors of the even strings and the first drain selection transistors of the odd strings.

6 Claims, 14 Drawing Sheets

NONVOLATILE MEMORY DEVICE, METHOD FOR FABRICATING THE SAME, AND METHOD FOR OPERATING THE SAME

CROSS-REFERENCE TO RELATED APPLICATIONS

This application is a division of U.S. patent application Ser. No. 13/333,924 filed on Dec. 21, 2011, which claims priority of Korean Patent Application No. 10-2011-0019511, filed on Mar. 4, 2011. The disclosure of each of the foregoing application is incorporated herein by reference in its entirety.

BACKGROUND

1. Field

Exemplary embodiments of the present invention relate to a nonvolatile memory device, a method for fabricating the same, and a method for operating the same.

2. Description of the Related Art

A nonvolatile memory device is a memory device in which stored data are maintained as they are even though power supply is interrupted. Currently, various nonvolatile memory devices such as a NAND type flash memory are widely used.

FIG. 1 is a circuit diagram showing a conventional nonvolatile memory device.

Referring to FIG. 1, a conventional nonvolatile memory device includes a plurality of bit lines BL which extend in a column direction and are arranged parallel to one another and a source line SL which extends in a row direction. The bit lines BL include even bit lines BLe and odd bit lines BLo which are alternately arranged.

A string, in which a drain selection transistor DST, a plurality of memory transistors MT, and a source selection transistor SST are connected in series, is disposed between each bit line BL and the source line SL.

A drain selection line DSL is connected to the gate electrodes of drain selection transistors DST and extends in the row direction. Word lines WL are connected to the control gate electrodes of memory transistors MT and extend in the row direction. A source selection line SSL is connected to the gate electrodes of source selection transistors SST and extends in the row direction.

In the nonvolatile memory device configured as described above, a data program operation and a data read operation are performed on every page as a unit. In particular, an even page program operation for programming a certain cell of the string connected to the even bit line BLe and an odd page program operation for programming a certain cell of the string connected to the odd bit line BLo are separately performed. Even page read and odd page read operations are applied in the same manner.

However, the conventional nonvolatile memory device has the following features.

In the conventional nonvolatile memory device, since the bit lines BL and the source line SL extend in different directions, they may not be disposed on the same layer. That is to say, the bit lines BL and the source line SL are to be formed as different layers through different processes. In this case, since mask processes and etching processes are to be separately performed in order to form the bit lines BL and the source line SL, processes become complicated.

Also, in the conventional nonvolatile memory device, the source line SL is connected to all strings in common. Accordingly, in a read operation, the way of sensing voltage changes in the respective bit lines BL is to be used. However, in this case, sensing noise may increase.

SUMMARY

Embodiments of the present invention are directed to a nonvolatile memory device which may simplify fabrication processes and increase operational properties, a method for fabricating the same, and a method for operating the same.

In accordance with an embodiment of the present invention, a nonvolatile memory device includes: bit lines and source lines alternately arranged parallel to each other; even strings and odd strings alternately arranged between the bit lines and the source lines and each including drain selection transistors, memory transistors, and a source selection transistor, wherein the drain selection transistors include a first drain selection transistor with the same structure as the memory transistors and a second drain selection transistor with the same structure as the source selection transistor; an even drain selection line connected to the first drain selection transistors of the even strings and the second drain selection transistors of the odd strings; and an odd drain selection line connected to the second drain selection transistors of the even strings and the first drain selection transistors of the odd strings.

In accordance with another embodiment of the present invention, a method for operating a nonvolatile memory device which comprises bit lines and source lines alternately arranged parallel to each other and even strings and odd strings respectively and alternately arranged between the bit lines and the source lines and each including drain selection transistors, memory transistors, and a source selection transistor, wherein the drain selection transistors include a first drain selection transistor with the same structure as the memory transistors and a second drain selection transistor with the same structure as the source selection transistor includes: performing an even page program on memory transistors which belong to the even strings and are to be programmed by turning-on the first and second drain selection transistors of the even strings and turning-off the second drain selection transistors of the odd strings; and performing an odd page program on memory transistors which belong to the odd strings and are to be programmed by turning-on the first and second drain selection transistors of the odd strings and turning-off the second drain selection transistors of the even strings.

In accordance with another embodiment of the present invention, a method for operating a nonvolatile memory device which comprises bit lines and source lines alternately arranged parallel to each other and even strings and odd strings respectively and alternately arranged between the bit lines and the source lines and each including drain selection transistors, memory transistors, and a source selection transistor, wherein the drain selection transistors include a first drain selection transistor with the same structure as the memory transistors and a second drain selection transistor with the same structure as the source selection transistor includes: performing an even page read on memory transistors which belong to the even strings and are to be read by turning-on the first and second drain selection transistors of the even strings and turning-off the second drain selection transistors of the odd strings; and performing an odd page read on memory transistors which belong to the odd strings and are to be read by turning-on the first and second drain selection transistors of the odd strings and turning-off the second drain selection transistors of the even strings.

In accordance with yet another embodiment of the present invention, a nonvolatile memory device includes: a substrate having an active region defined by isolation layers and including a plurality of first regions which extend in one direction and second and third regions which are disposed alternately between the first regions to connect the first regions with one another; a source selection line, word lines, and first and second drain selection lines disposed over the substrate and extending to cross the first regions between the second and third regions; first and second contacts disposed over the second and third regions, respectively; and first and second wiring lines respectively connected with the first and second contacts and extending parallel to one another, wherein each of the first and second drain selection lines includes a stack structure of a tunnel dielectric layer, a floating gate, an intergate dielectric layer, and a control gate, and wherein the first drain selection line has portions of the intergate dielectric layer removed at intersections with odd-numbered first regions among the first regions and the second drain selection line has portions of the intergate dielectric layer removed at intersections with even-numbered first regions among the first regions, which overlap with the second drain selection line.

In accordance with still another embodiment of the present invention, a method for fabricating a nonvolatile memory device includes: forming isolation layers in a substrate to define an active region including a plurality of first regions which extend in one direction and second and third regions which are disposed alternately between the first regions to connect the first regions with one another; forming a source selection line, word lines and first and second drain selection lines over the substrate to extend while crossing the first regions between the second and third regions; forming a dielectric layer which covers the source selection line, the word lines, and the first and second drain selection lines; forming first and second contacts in the dielectric layer to be respectively connected with the second and third regions; and forming first and second wiring lines over the dielectric layer to be respectively connected with the first and second contacts and extend parallel to one another, wherein each of the first and second drain selection lines includes a stack structure of a tunnel dielectric layer, a floating gate, an intergate dielectric layer, and a control gate, and wherein the first drain selection line has portions of the intergate dielectric layer removed at intersections with odd-numbered first regions among the first regions and the second drain selection line has portions of the intergate dielectric layer removed at intersections with even-numbered first regions among the first regions.

DETAILED DESCRIPTION

Figure 1:
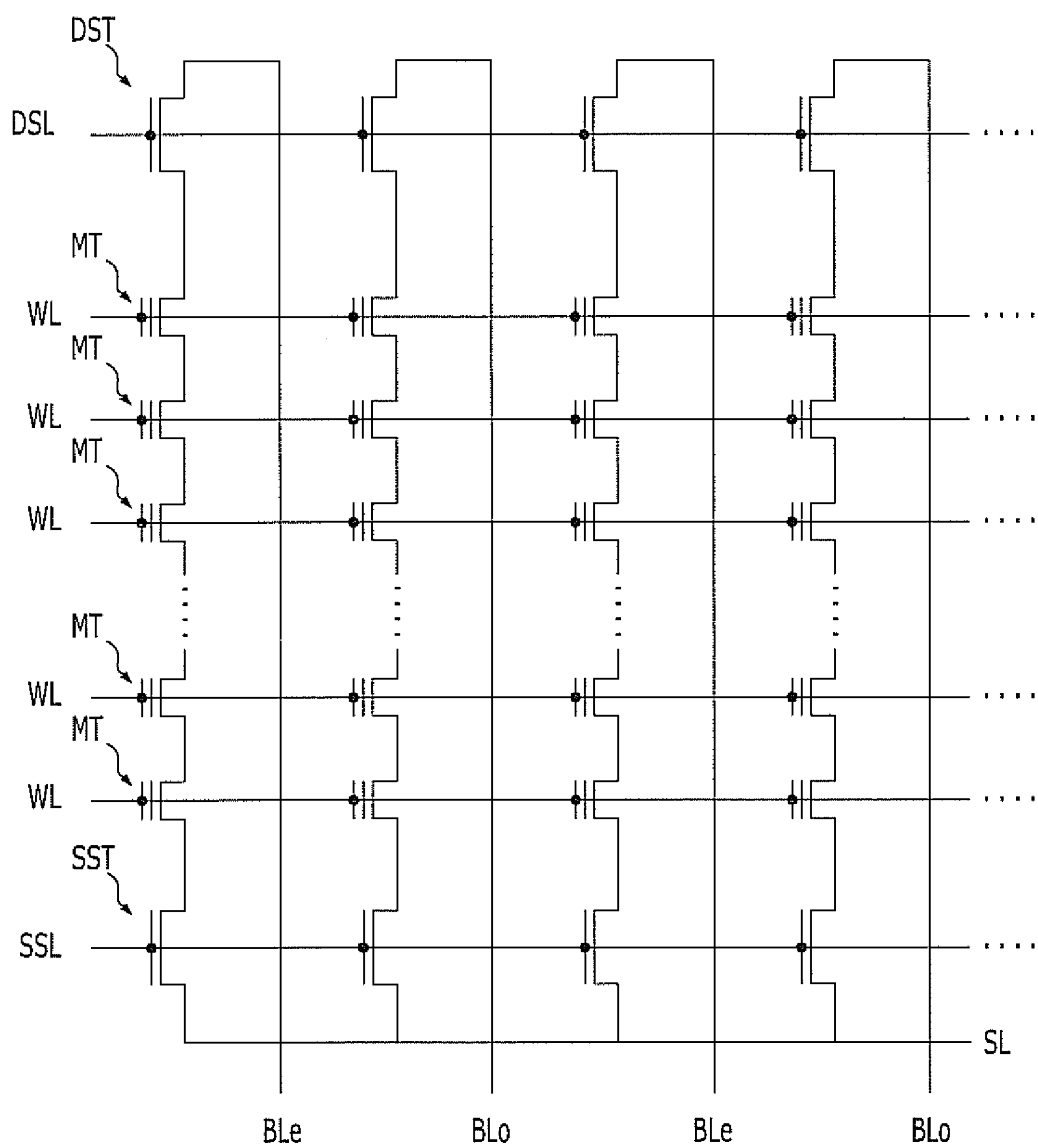
FIG. 1 is a circuit diagram showing a conventional nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
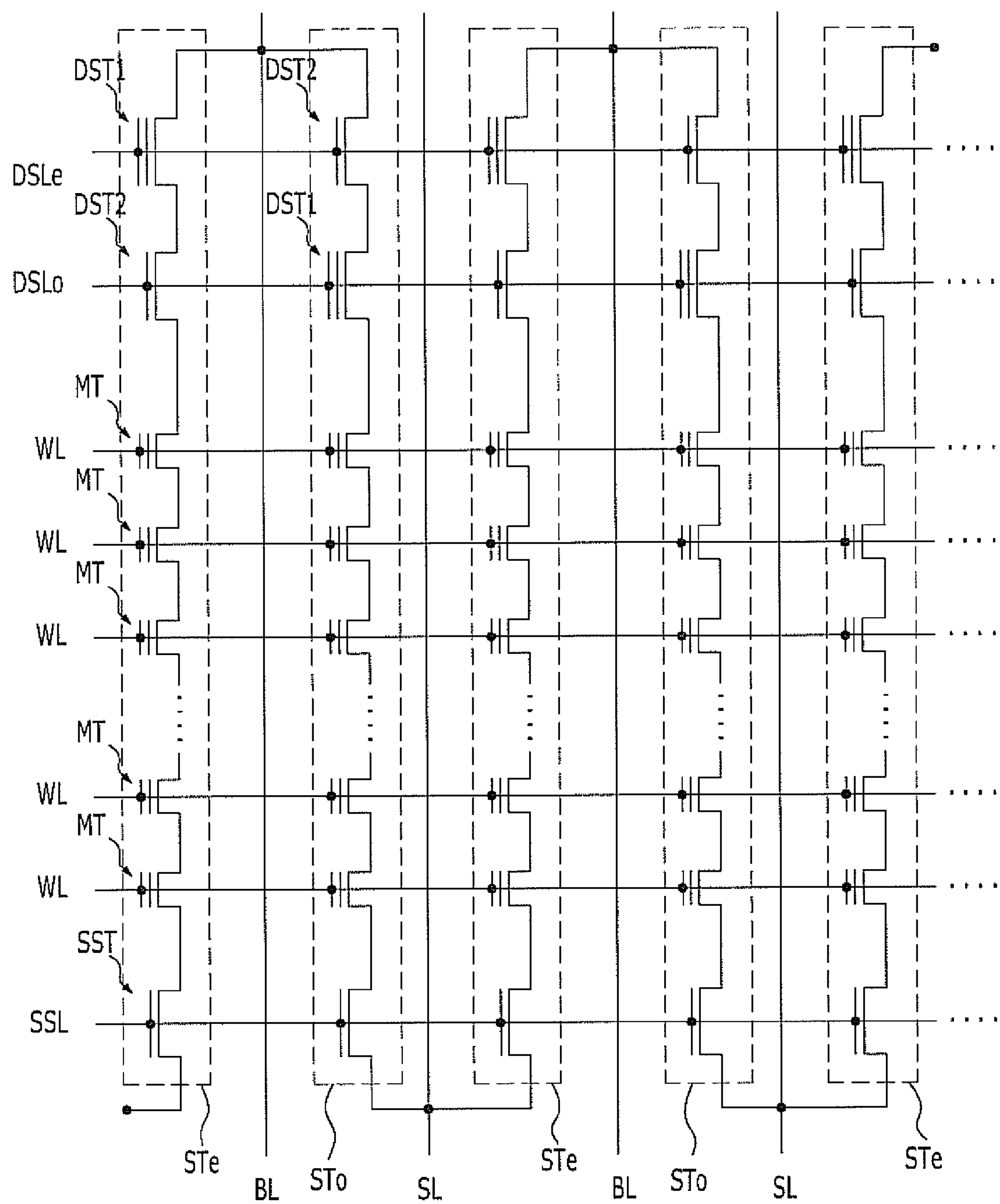
FIG. 2 is a circuit diagram showing a nonvolatile memory device in accordance with an embodiment of the present invention.
Figure 3:
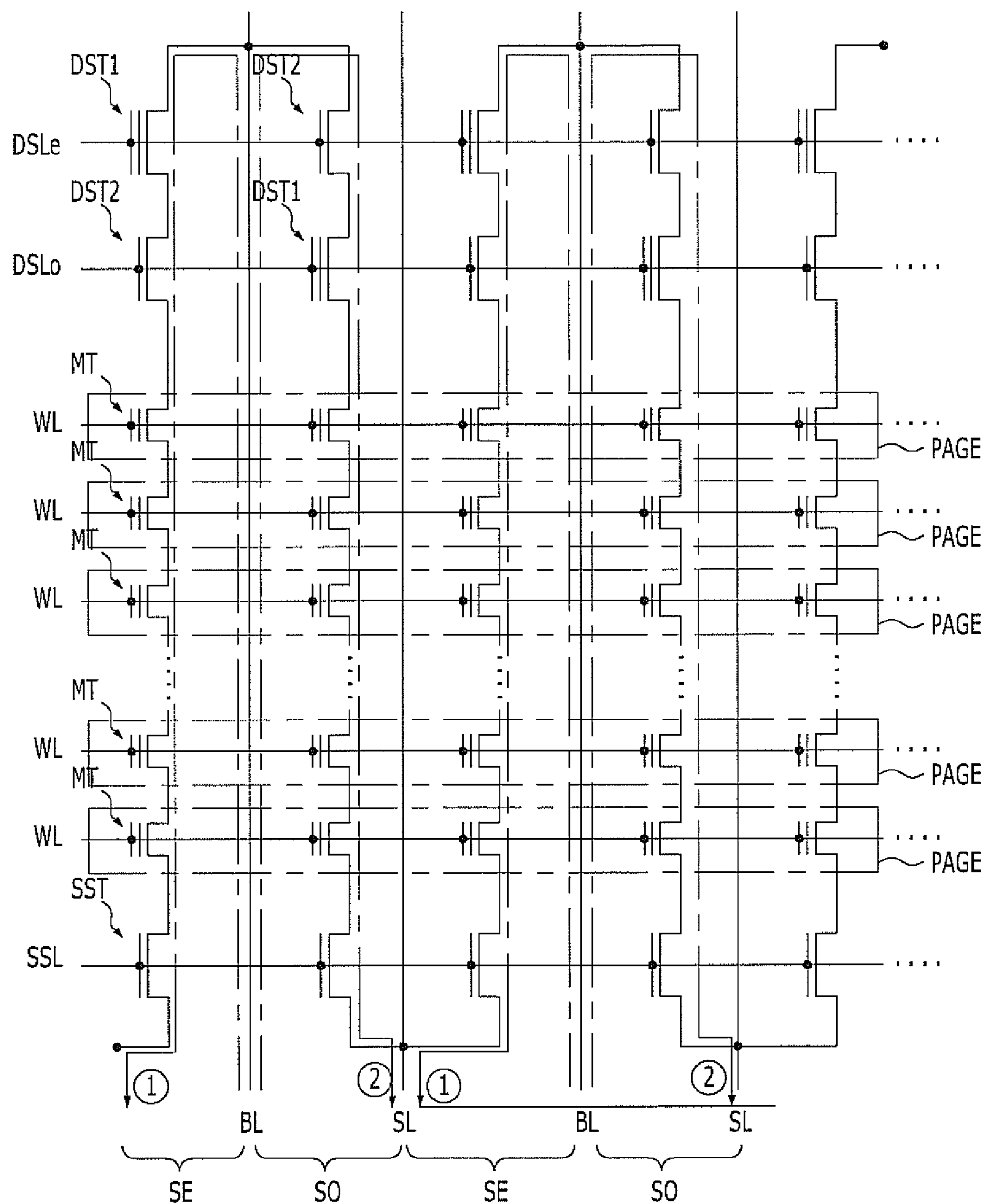
FIG. 3 is a circuit diagram explaining a method for operating the nonvolatile memory device shown in FIG. 2.
Figure 4A:
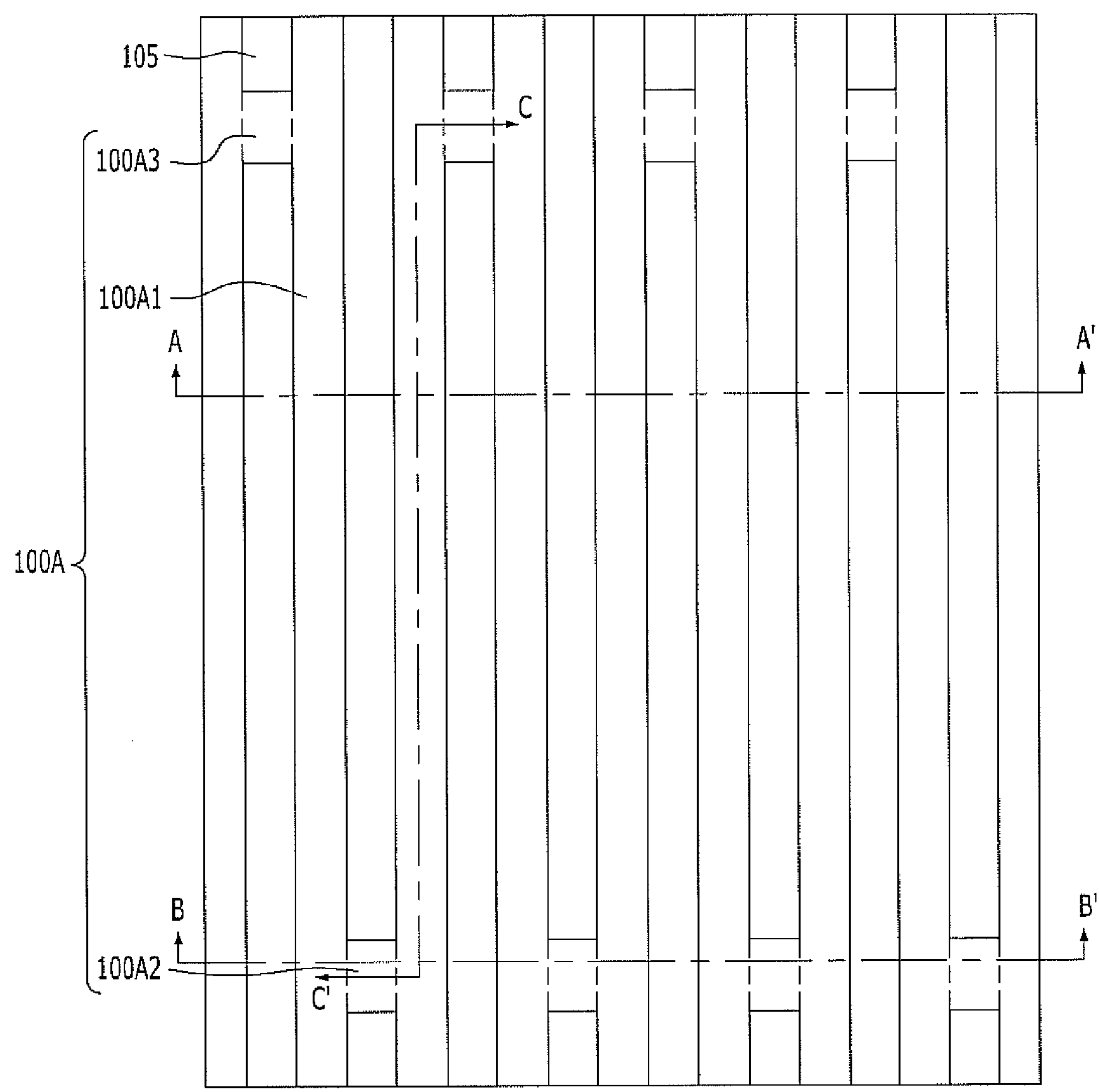
FIGS. 4A to 8B are plan views and cross-sectional views showing the nonvolatile memory device in accordance with the embodiment of the present invention and a method for fabricating the same.
Figure 4B:
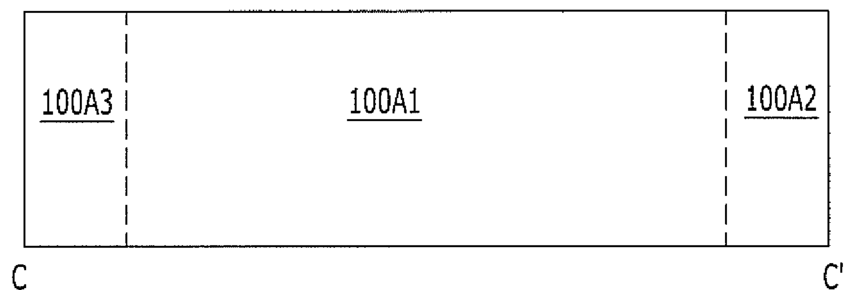
Figure 4C:
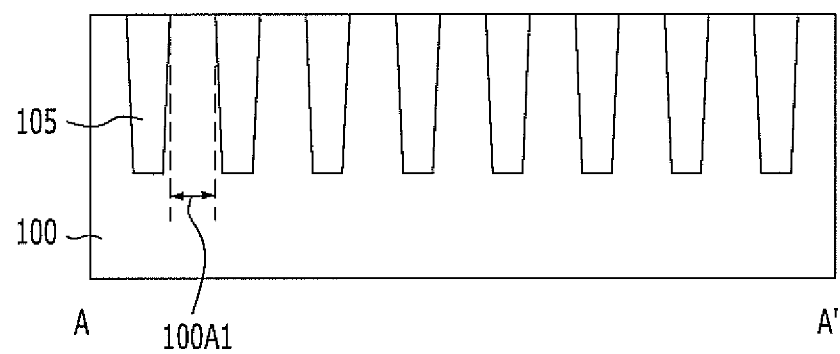
Figure 4D:
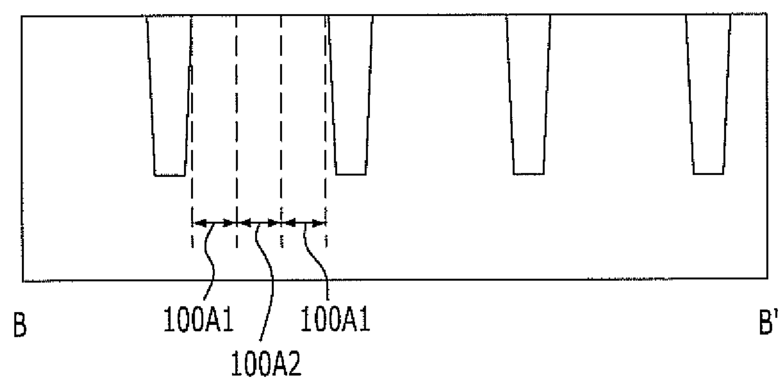

Hereafter, a nonvolatile memory device and a method for operating the same in accordance with embodiments of the present invention will be described with reference to FIGS. 2 and 3. FIG. 2 is a circuit diagram showing a nonvolatile memory device in accordance with an embodiment of the present invention, and FIG. 3 is a circuit diagram explaining a method for operating the nonvolatile memory device shown in FIG. 2.

Referring to FIG. 2, a nonvolatile memory device in accordance with an embodiment of the present invention includes a plurality of bit lines BL and a plurality of source lines SL which extend in one direction, for example, a column direction. The bit lines BL and the source lines SL are disposed parallel to one another and are alternately arranged.

Strings STe and STo, in each of which a pair of drain selection transistors DST1 and DST2, a plurality of memory transistors MT and a source selection transistor SST are connected in series, are disposed between the bit lines BL and the source lines SL.

The pair of drain selection transistors DST1 and DST2 include a first drain selection transistor DST1 which has the same structure as the memory transistor MT, that is, a stack structure of a floating gate electrode and a control gate electrode, and a second drain selection transistor DST2 which has the structure of a general transistor, for example, the same structure as the source selection transistor SST.

The strings STe and STo include even strings STe and odd strings STo which are alternately disposed between the bit lines BL and the source lines SL. The even strings STe and the odd strings STo may be differentiated from each other by the relative positions of the first and second drain selection transistors DST1 and DST2. That is to say, the positions of the first and second drain selection transistors DST1 and DST2 in the even string STe and the positions of the first and second drain selection transistors DST1 and DST2 in the odd string STo are opposite to each other. For example, in the even string STe, the first drain selection transistor DST1 may be disposed at one end of the even string STe and one node of the first drain selection transistor DST1 is connected to the bit line BL, and the second drain selection transistor DST2 may be disposed between the first drain selection transistor DST1 and the memory transistor MT. Conversely, in the odd string STo, the second drain selection transistor DST2 may be disposed at one end of the odd string STo and one node of the second drain selection transistor DST2 is connected to the bit line BL, and the first drain selection transistor DST1 may be disposed between the second drain selection transistor DST2 and the memory transistor MT.

In order to control the first and second drain selection transistors DST1 and DST2, a pair of drain selection lines DSLe and DSLo are connected to the control gate electrodes of the first drain selection transistors DST1 and the gate electrodes of the second drain selection transistors DST2 and extend in the row direction. In detail, the pair of drain selection lines DSLe and DSLo include an even drain selection line DSLe and an odd drain selection line DSLo. The even drain selection line DSLe may connect the control gate electrodes of the first drain selection transistors DST1 of the even strings STe and the gate electrodes of the second drain selection transistors DST2 of the odd strings STo and may extend in the row direction. Also, the odd drain selection line DSLo may connect the gate electrodes of the second drain selection transistors DST2 of the even strings STe and the control gate electrodes of the first drain selection transistors DST1 of the odd strings STo and may extend in the row direction.

Word lines WL for controlling the memory transistors MT may be connected to the control gate electrodes of the memory transistors MT and may extend in the row direction.

A source selection line SSL for controlling source selection transistors SST may be connected to the gate electrodes of the source selection transistors SST and may extend in the row direction.

An even string STe and an odd string STo, which are adjacent to each other, share one bit line BL. When regarding the even string STe and the odd string STo sharing one bit line BL as a pair of even string STe and odd string STo, an even string STe and an odd string STo, which belong to different pairs and are adjacent to each other, share one source line SL. Namely, in the pair of even string STe and odd string STo, one node of the first drain selection transistor DST1 of the even string STe and one node of the second drain selection transistor DST2 of the odd string STo are connected to the same bit line BL. Further, in the even string STe and the odd string STo which belong to different pairs and are adjacent to each other, one node of the source selection transistor SST of the even string STe and one node of the source selection transistor SST of the odd string STo are connected to the same source line SL.

For example, when ordering the even and odd strings STe and STo, the bit lines BL, and the source lines SL from the left, the first pair of even string STe and odd string STo share the first bit line BL. The second pair of even string STe and odd string STo share the second bit line BL. The first odd string STo and the second even string STe share the first source line SL. The second odd string STo and the third even string STe share the second source line SL. This structure is repeated.

In the nonvolatile memory device configured as described above, a method for programming data and a method for reading data will be described below with reference to FIGS. 2 and 3.

First, an erase operation is performed as an initialization step for program. That is to say, the data stored in the plurality of memory transistors MT, for example, the charges stored in the floating gate electrodes of the plurality of memory transistors MT are erased. At this time, the charges stored in the floating gate electrodes of the first drain selection transistors DST1 with the same structure as the memory transistors MT are erased as well.

To this end, a low voltage, for example, 0V may be applied to the even and odd drain selection lines DSLe and DSLo and the word lines WL, and a high voltage, for example, 20V may be applied to a substrate body (not shown) on which the first and second drain selection transistors DST1 and DST2, the memory transistors MT, etc. are disposed. The bit lines BL and the source lines SL may be floated.

Next, a program operation is performed. The program operation is performed on every page PAGE as a unit by being divided into a program of an even page and a program of an odd page.

In detail, when the plurality of memory transistors MT connected to one word line WL constitute one page PAGE, a program of memory transistors MT belonging to even strings STe, among the plurality of memory transistors MT included in the page PAGE connected to one selected word line WL, is referred to as a program of an even page, and a program of memory transistors MT belonging to odd strings STo, among the plurality of memory transistors MT included in the page PAGE connected to the one selected word line WL, is referred to as a program of an odd page. The program of an even page and the program of an odd page are separately performed with a time interval.

It was described above that the pair of even string STe and odd string STo share one bit line BL. Accordingly, the program of an even page and the program of an odd page are respectively performed in the following ways.

In order to perform the program of an even page, in the state that a program voltage, for example, 18V is applied to the one selected word line WL, a pass voltage lower than the program voltage, for example, 10V is applied to the remaining unselected word lines WL, and a turn-off voltage of the source selection transistors SST, for example, 0V is applied to the source selection line SSL, a turn-on voltage of the first drain selection transistors DST1, for example, 0V is applied to the even drain selection line DSLe, and a turn-on voltage of the second drain selection transistors DST2, for example, the power supply voltage Vcc is applied to the odd drain selection line DSLo. The reason why the turn-on voltage of the first drain selection transistors DST1 as 0V is lower than the turn-on voltage of the second drain selection transistors DST2 is that the first drain selection transistors DST1 are in an erased state.

In this case, all the first and second drain selection transistors DST1 and DST2 of the even strings STe are in a turned-on state, whereas the second drain selection transistors DST2 of the odd strings STo are in a turned-off state. Accordingly, between the pair of even string STe and odd string STo which share one bit line BL, only the even string STe is connected to the bit line BL, and the odd string STo is not connected to the bit line BL. That is to say, in the program operation of an even page, the one bit line BL may be used as the bit line of the even page.

In this state, the program of storing desired data to the memory transistors MT of the select word line WL, which belong to even strings STe, may be performed. In other words, predetermined voltages, for example, 0V and the power supply voltage Vcc, for storing desired data, for example, '0' data and '1' data, may be applied to the bit lines BL connected to the even strings STe.

Conversely, in order to perform the program of an odd page, in the state that the program voltage, for example, 18V is applied to the one selected word line WL, the pass voltage lower than the program voltage, for example, 10V is applied to the remaining unselected word lines WL, and the turn-off voltage of the source selection transistors SST, for example, 0V is applied to the source selection line SSL, the turn-on voltage of the first drain selection transistors DST1, for example, 0V is applied to the odd drain selection line DSLo, and the turn-on voltage of the second drain selection transistors DST2, for example, the power supply voltage Vcc is applied to the even drain selection line DSLe. That is to say, in contrast to the program operation of an even page, voltages are applied to the even and odd drain selection lines DSLe and DSLo.

In this case, all the first and second drain selection transistors DST1 and DST2 of the odd strings STo are in a turned-on state, whereas the second drain selection transistors DST2 of the even strings STe are in a turned-off state. Accordingly, between the pair of even string STe and odd string STo which share one bit line BL, only the odd string STo is connected to the bit line BL, and the even string STe is not connected to the bit line BL. That is to say, in the program operation of an odd page, the one bit line BL may be used as the bit line of the odd page.

In this state, the program of storing desired data to the memory transistors MT of the selected word line WL, which belong to odd strings STo, may be performed. In other words, predetermined voltages, for example, 0V and the power supply voltage Vcc, for storing desired data, for example, '0' data and '1' data, may be applied to the bit lines BL connected to the odd strings STo.

In brief, the pair of even string STe and odd string STo share one bit line BL, and by controlling the voltages respectively applied to the even and odd drain selection lines DSLe and DSLo, one bit line BL may be selectively used as the bit line BL of an even page or as the bit line BL of an odd page.

Next, an operation for reading programmed data is performed. Similar to the program operation, the read operation may be divided into a read operation of an even page and a read operation of an odd page.

In detail, when the plurality of memory transistors MT connected to one word line WL constitute one page PAGE, a read of memory transistors MT belonging to even strings STe, among the plurality of memory transistors MT included in the page PAGE connected to one selected word line WL, is referred to as a read of an even page, and a read of memory transistors MT belonging to odd strings STo, among the plurality of memory transistors MT included in the page PAGE connected to the one selected word line WL, is referred to as a read of an odd page. The read of an even page and the read of an odd page are separately performed with a time interval.

It was described above that the pair of even string STe and odd string STo share one bit line BL. Accordingly, the read of an even page and the read of an odd page are respectively performed in the following ways.

In order to perform the read of an even page, in the state that a read voltage, for example, 0V is applied to the one selected word line WL and a pass voltage higher than the read voltage, for example, 4.5V is applied to the remaining unselected word lines WL and the source selection line SSL, a turn-on voltage of the first drain selection transistors DST1, for example, DV is applied to the even drain selection line DSLe, and a turn-on voltage of the second drain selection transistors DST2, for example, the power supply voltage Vcc is applied to the odd drain selection line DSLo.

In this case, all the first and second drain selection transistors DST1 and DST2 of the even strings STe are in a turned-on state, whereas the second drain selection transistors DST2 of the odd string STo are in a turned-off state. Accordingly, between the pair of even string STe and odd string STo which share one bit line BL, only the even string STe is connected to the bit line BL, and the odd string STo is not connected to the bit line BL. That is to say, in the read operation of an even page, the one bit line BL is used as the bit line of the even page.

In this state, a current path ① may be formed between the bit line BL and the source line SL respectively connected to one end and the other end of each even string STe as indicated by the alternate long and short dash line. The current path ① has different states depending upon the data stored in the memory transistor MT of the corresponding even string STe to be read. For example, when data of '0' is stored in the memory transistor MT of the even string STe to be read, the current path ① may be in a disconnected state, and when data of '1' is stored in the memory transistor MT of the even string STe to be read, the current path ① may be in a connected state. Accordingly, by sensing current flowing between the bit line BL and the source line SL which are respectively connected to one end and the other end of each even string STe (see the reference symbol SE), the data stored in the memory transistor MT of each even string STe to be read may be read.

In order to perform the read of an odd page after programming the odd page, in the state that the read voltage, for example, 0V is applied to the one selected word line WL and the pass voltage higher than the read voltage, for example, 4.5V is applied to the remaining unselected word lines WL and the source selection line SSL, a turn-on voltage of the first drain selection transistors DST1, for example, 0V is applied to the odd drain selection line DSLo, and a turn-on voltage of the second drain selection transistors DST2, for example, the power supply voltage Vcc is applied to the even drain selection line DSLe. That is to say, in contrast to the read operation of an even page, voltages are applied to the even and odd drain selection lines DSLe and DSLo.

In this case, all the first and second drain selection transistors DST1 and DST2 of the odd strings STo are in a turned-on state, whereas the second drain selection transistors DST2 of the even string STe are in a turned-off state. Accordingly, between the pair of even string STe and odd string STo which share one bit line BL, only the odd string STo is connected to the bit line BL, and the even string STe is not connected to the bit line BL. That is to say, in the read operation of an odd page, the one bit line BL is used as the bit line of the odd page.

In this state, a current path ② may be formed between the bit line BL and the source line SL respectively connected to one end and the other end of each odd string STo as indicated by the alternate long and short dash line. The current path ② has different states depending upon the data stored in the memory transistor MT of the corresponding odd string STo to be read. For example, when data of '0' is stored in the memory transistor MT of the odd string STo to be read, the current path ② may be in a disconnected state, and when data of '1' is stored in the memory transistor MT of the odd string STo to be read, the current path ② may be in a connected state. Accordingly, by sensing current between the bit line BL and the source line SL which are respectively connected to one end and the other end of each odd string STo (see the reference symbol SO), the data stored in the memory transistor MT of each odd string STo to be read may be read.

Hereinbelow, the nonvolatile memory device in accordance with the embodiment of the present invention and a method for fabricating the same will be described with reference to FIGS. 4A to 8B. FIGS. 8A and 8B are a plan view and a cross-sectional view illustrating the nonvolatile memory device in accordance with the embodiment of the present invention, and FIGS. 4A to 7B are plan views and cross-sectional views showing the processes of a method for fabricating the nonvolatile memory device shown in FIGS. 8A and 8B. The nonvolatile memory device shown in FIGS. 8A and 8B substantially corresponds to the nonvolatile memory device shown in FIG. 2.

First, the fabrication method will be described below with reference to FIGS. 4A to 8B.

Referring to FIGS. 4A to 4D, an active region 100A is defined by forming isolation layers 105 in a substrate 100.

The substrate 100 may be a semiconductor substrate such as a silicon substrate. The isolation layers 105 may be formed through STI (shallow trench isolation) and may include, for example, an oxide layer.

The isolation layers 105 have the shapes of bars and are disposed in such a manner that a major axis thereof corresponds to a first direction, for example, a column direction, and a minor axis thereof corresponds to a second direction crossing with the first direction, for example, a row direction. A plurality of isolation layers 105 are arranged along the first direction and the second direction. The plurality of isolation layers 105 are arranged in line in the first direction and are arranged in zigzag in the second direction.

Accordingly, the active region 100A has the shape as shown in the drawings. Namely, the active region 100A includes first regions 100A1 which are disposed between the isolation layers 105 arranged in the second direction and extend in the first direction, and second and third regions 100A2 and 100A3 which are disposed alternately at opposite positions between the isolation layers 105 arranged in the first direction. The first regions 100A1 are connected with one another by the second and third regions 100A2 and 100A3.

A region of each first region 100A1, which corresponds to between the second and third regions 100A2 and 100A3, becomes a region where one string STe or STo (see FIG. 2) described above is disposed, and hereinafter, for the purpose in explanation, this region will be referred to as a unit string region. A plurality of unit string regions are arranged in the second direction. The above-described drain selection lines DSLe and DSLo, word lines WL and source selection line SSL extend in the second direction while crossing the unit string regions.

Figure 5A:
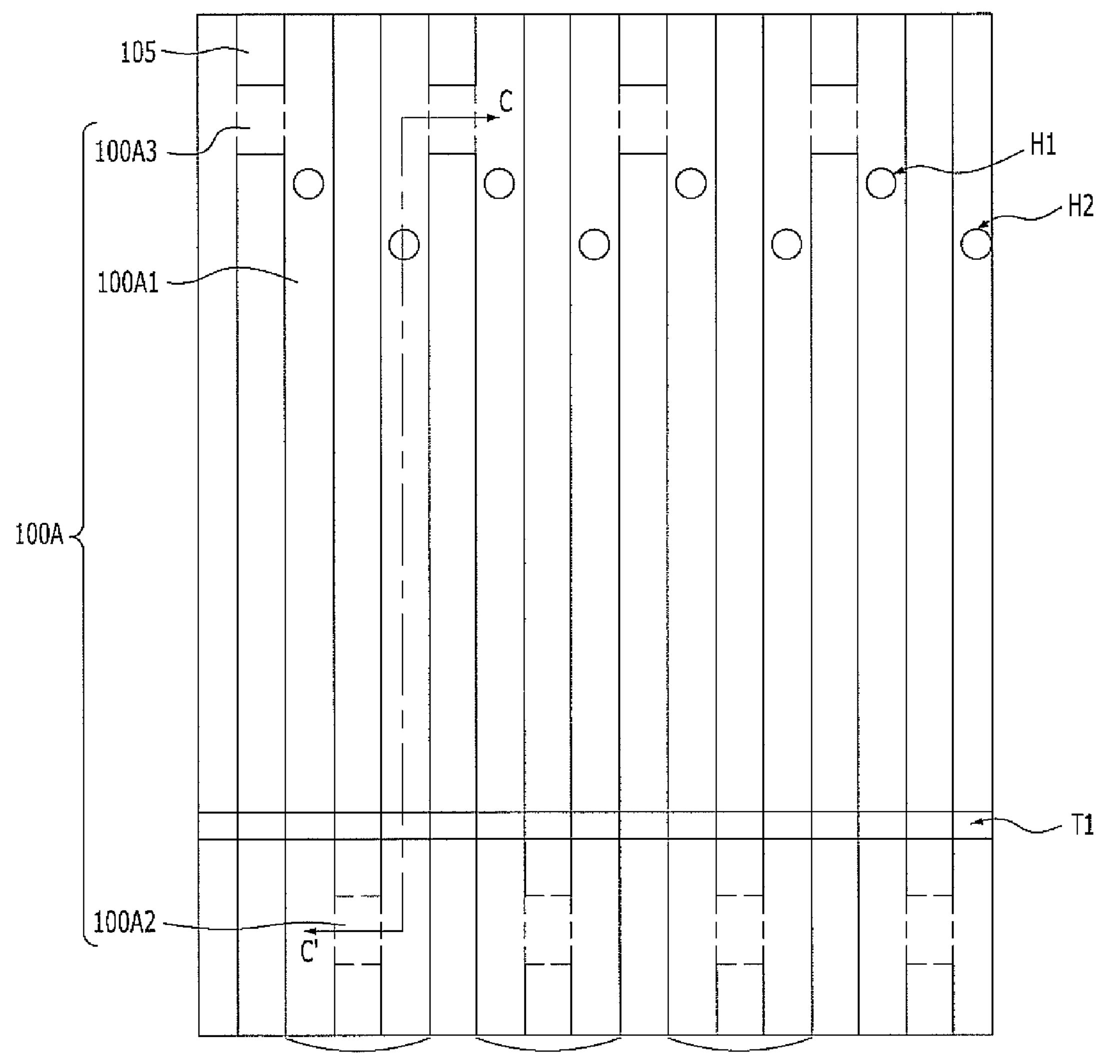
Figure 5B:
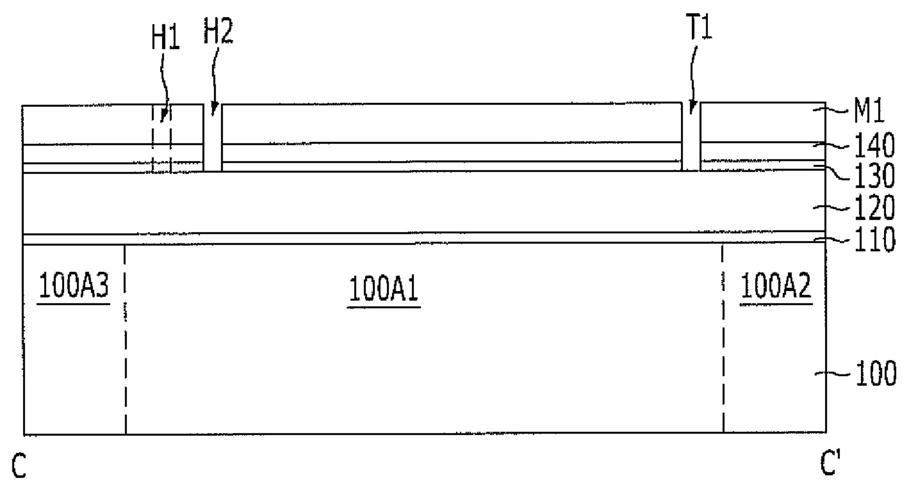

Referring to FIGS. 5A and 5B, a tunnel dielectric layer 110, a first conductive layer 120 for formation of floating gate electrodes, and an intergate dielectric layer 130 for isolating floating gate electrodes and control gate electrodes from each other are sequentially formed on the substrate 100 including the isolation layers 105. The tunnel dielectric layer 110 may be an oxide layer, the first conductive layer 120 may be a polysilicon layer, and the intergate dielectric layer 130 may be an ONO (oxide-nitride-oxide) layer.

Then, a capping layer 140 is formed on the intergate dielectric layer 130. The capping layer 140 is to protect the intergate dielectric layer 130 during a subsequent process and may include, for example, polysilicon.

Next, by coating a photoresist on the capping layer 140 and exposing and developing the photoresist, a mask pattern M1 is formed to have predetermined openings corresponding to first holes H1, second holes H2 and a first trench T1. By etching the capping layer 140 and the intergate dielectric layer 130 using the mask pattern M1 as an etch mask, portions of the intergate dielectric layer 130 are removed to form the first holes H1, the second holes H2 and the first trench T1.

The first holes H1 are defined alternately in the first regions 100A1 arranged in the second direction (i.e., a region which any one of the pair of drain selection lines DSLe and DSLo described above, for example, the even drain selection line DSLe is to be formed for overlapping). For example, the first holes H1 may be defined in odd-numbered first regions 100A1 among the first regions 100A1 which are arranged in the second direction. The first holes H1 may have a width smaller than that of the drain selection lines DSLe and DSLo.

The second holes H2 are defined in the first regions 100A1 in which the first holes H1 are not defined, (i.e., a region which the other one of the pair of drain selection lines DSLe and DSLo described above, for example, the odd drain selection line DSLo is to be formed for overlapping. For example, the second holes H2 may be defined in even-numbered first regions 100A1 among the first regions 100A1 which are arranged in the second direction. The second holes H2 may have a width smaller than that of the drain selection lines DSLe and DSLo.

The first trench T1 may have the shape of a line which corresponds to a region where the source selection line SSL described above is to be formed and extends in the second direction. The width of the first trench T1 in the first direction may be smaller than that of the source selection line SSL in the first direction.

The first and second holes H1 and H2 are defined to form the gate electrodes of second drain selection transistors DST2. As described above, the first drain selection transistors DST1 have the same structure as memory transistors MT, and accordingly, have floating gate electrodes and control gate electrodes which are isolated by the intergate dielectric layer 130. Conversely, as described above, the second drain selection transistors DST2 have the same structure as selection transistors generally known in the art, for example, source selection transistors SST, and accordingly, have floating gate electrodes and control gate electrodes which are connected with each other since at least portions of the intergate dielectric layer 130 interposed between the floating gate electrodes and the control gate electrodes are removed. That is, the whole or the part of the integrate dielectric layer 130 does not exist in the source selection transistors SST and the second drain selection transistors DST2. In the embodiment of the present invention, the first and second drain selection transistors DST1 and DST2 are included in one string, and the positions of the first and second drain selection transistors DST1 and DST2 are reversed between adjacent strings. Thus, the first and second holes H1 and H2 are defined to have the shapes and arrangements as described above.

The first trench T1 is defined to form the gate electrodes of the source selection transistors SST. As described above, the source selection transistors SST have floating gate electrodes and control gate electrodes which are connected with each other since at least portions of the intergate dielectric layer 130 interposed between the floating gate electrodes and the control gate electrodes are removed. Thus, the first trench T1 is defined to have the shape and arrangement as described above.

Although not shown in the drawings, the first conductive layer 120 may be patterned such that the first conductive layer 120 is divided for respective unit string regions. The first conductive layer 120 patterned in this way may have substantially the same shape, for example, as the first regions 100A1.

Figure 6A:
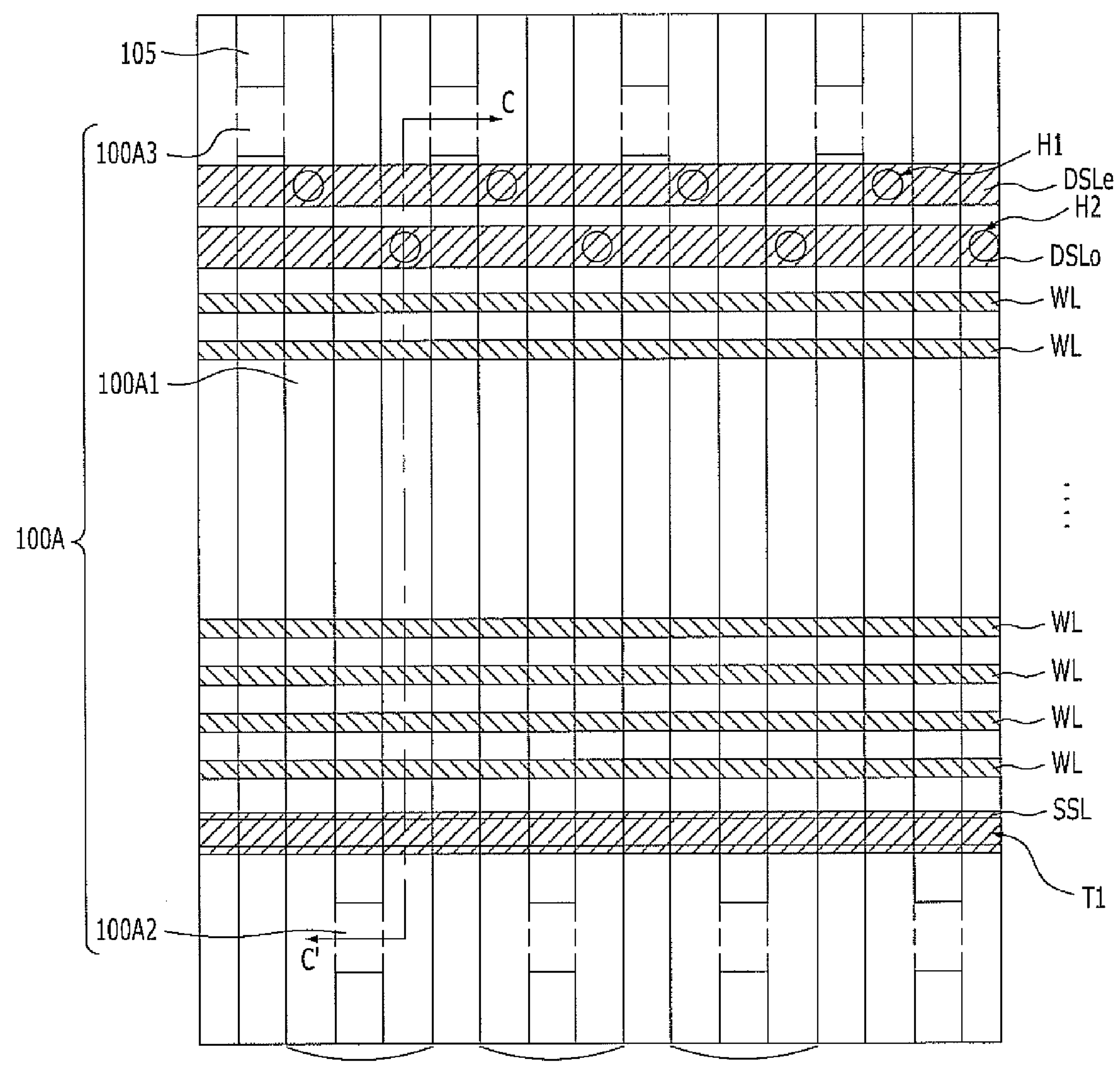
Figure 6B:
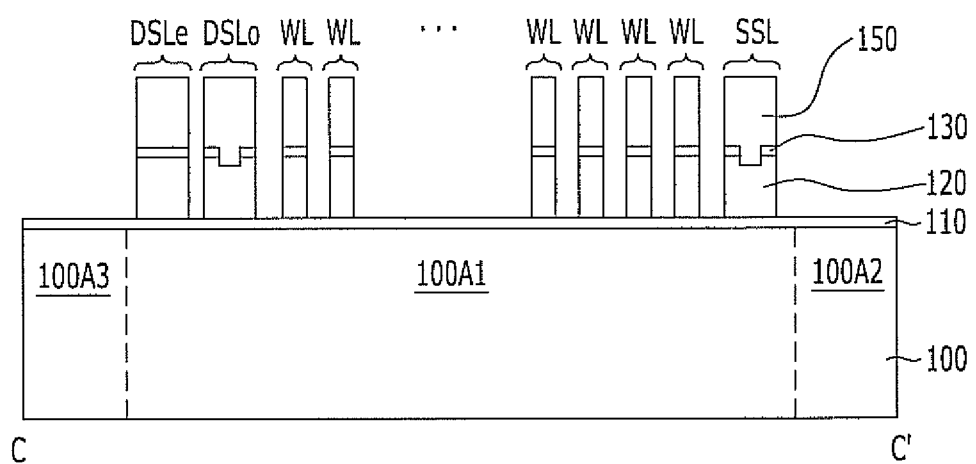

Referring to FIGS. 6A and 6B, after removing the first mask pattern M1 and the capping layer 140, a second conductive layer 150 for formation of control gate electrodes is formed on the resultant structure. The second conductive layer 150 may further include a silicide layer (not shown) formed thereon to have a low resistance value. The second conductive layer 150 may include polysilicon. The silicide layer may include a metal silicide, for example, a cobalt silicide.

Then, by patterning the stack structure of the first conductive layer 120, the intergate dielectric layer 130, and the second conductive layer 150, a pair of drain selection lines DSLe and DSLo, a plurality of word lines WL, and a source selection line SSL, which extend in the second direction, across the unit string regions, and are arranged parallel to one another, are formed.

The even drain selection line DSLe may extend in the second direction to cover the first holes H1 which are arranged in the second direction, and the odd drain selection line DSLo may extend in the second direction to cover the second holes H2 which are arranged in the second direction. The source selection line SSL may extend in the second direction to cover the first trench T1 which extends in the second direction. The word lines WL may be disposed between the drain selection lines DSLe and DSLo and the source selection line SSL.

As a result of this process, in one unit string region, the first drain selection transistor DST1, the second drain selection transistor DST2, the plurality of memory transistors MT, and the source selection transistor SST are disposed by being connected in series, and in another unit string region adjacent to the one unit string region, the second drain selection transistor DST2, the first drain selection transistor DST1, the plurality of memory transistors MT, and the source selection transistor SST are disposed by being connected in series.

The first drain selection transistor DST1 and the memory transistors MT have the same structure, that is, a structure in which the tunnel dielectric layer 110, the first conductive layer 120, the intergate dielectric layer 130, and the second conductive layer 150 are stacked. The second drain selection transistor DST2 and the source selection transistor SST have the same structure, that is, a structure in which the tunnel dielectric layer 110, the first conductive layer 120, the intergate dielectric layer 130, and the second conductive layer 150 are stacked and at least portions of the intergate dielectric layer 130 are removed such that the first conductive layer 120 and the second conductive layer 150 are electrically connected with each other.

The second conductive layer 150 of the first drain selection transistors DST1 and the second drain selection transistors DST2, which are alternately disposed in the respective unit string regions, extends in the second direction and constitutes the even drain selection line DSLe. The second conductive layer 150 of the second drain selection transistors DST2 and the first drain selection transistors DST1, which are alternately disposed in the respective unit string regions, extends in the second direction and constitutes the odd drain selection line DSLo. The second conductive layer 150 of the memory transistors MT, which are disposed in the respective unit string regions, extend in the second direction and constitutes the word lines WL. The second conductive layer 150 of the source selection transistors SST, which are disposed in the respective unit string regions, extend in the second direction and constitutes the source selection line SSL.

Thereupon, although not shown in the drawings, by performing an ion implantation process for forming source and drain regions, source and drain regions are formed in the active region 100A of the substrate 100. The drain regions are formed in portions of the active region 100A on one side of the drain selection lines DSLe and DSLo, in particular, the third regions 100A3, and the source regions are formed in portions of the active region 100A on one side of the source selection line SSL, in particular, the second regions 100A2.

Figure 7A:
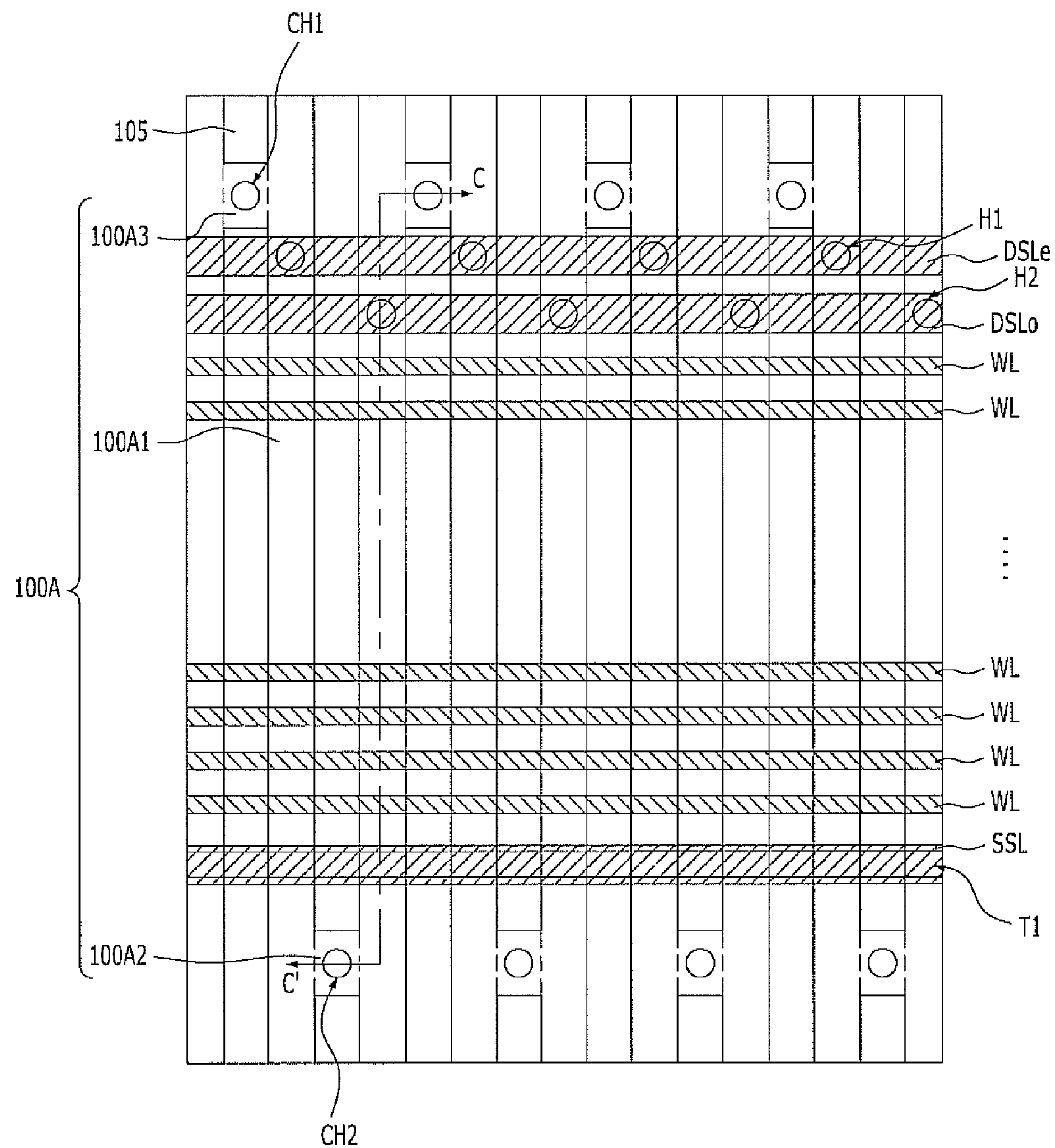
Figure 7B:
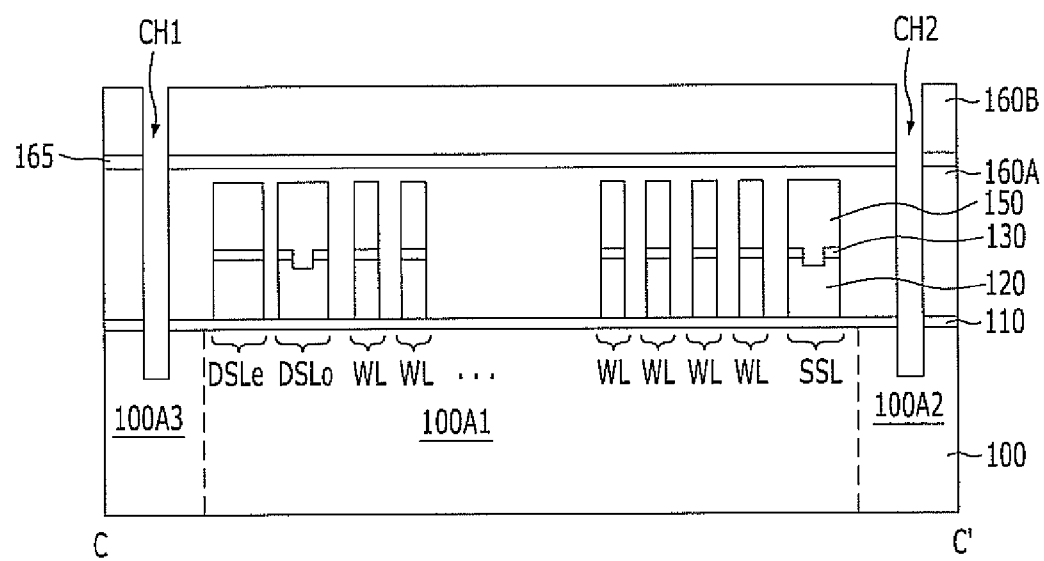
Figure 8A:
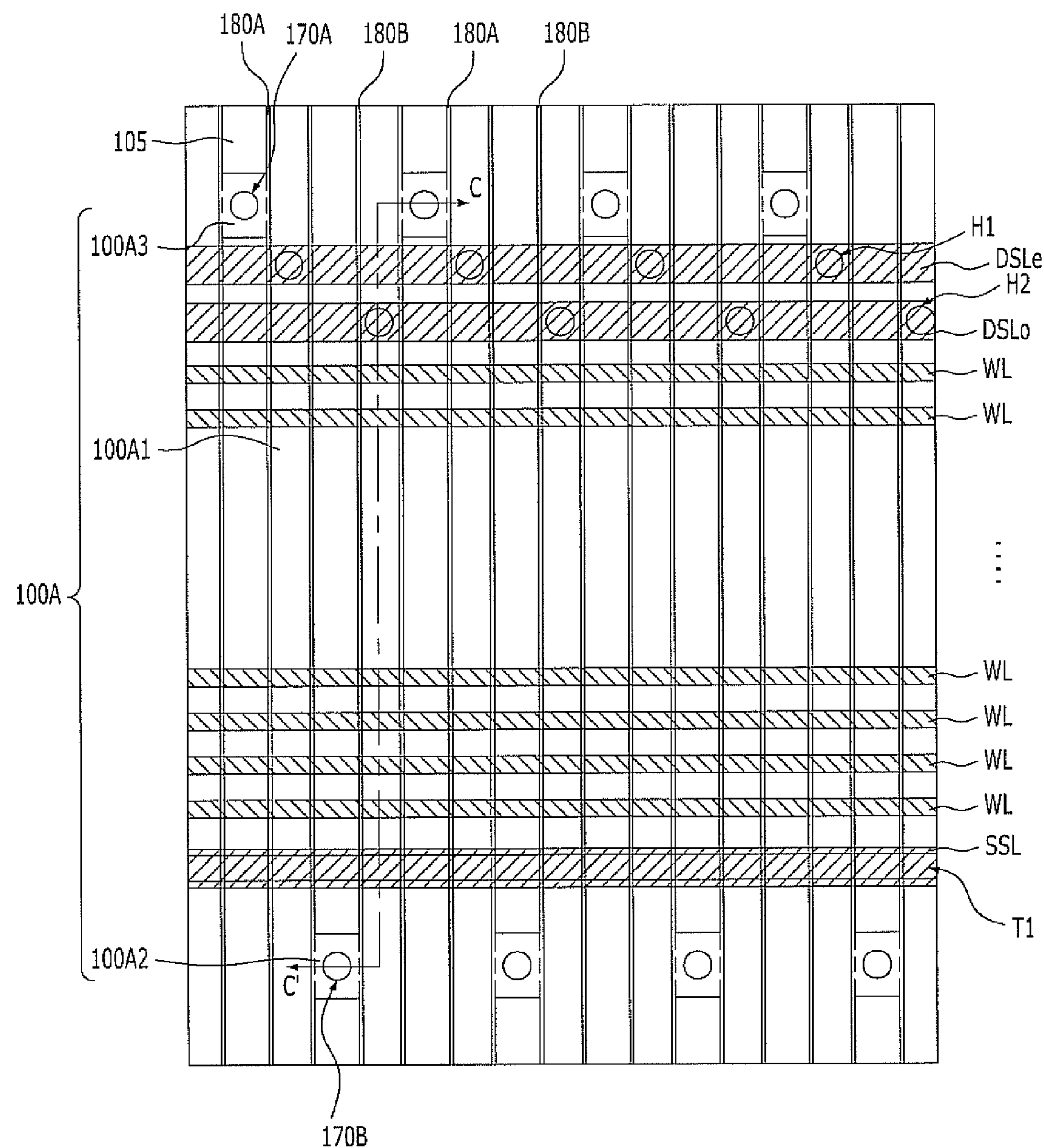
Figure 8B:
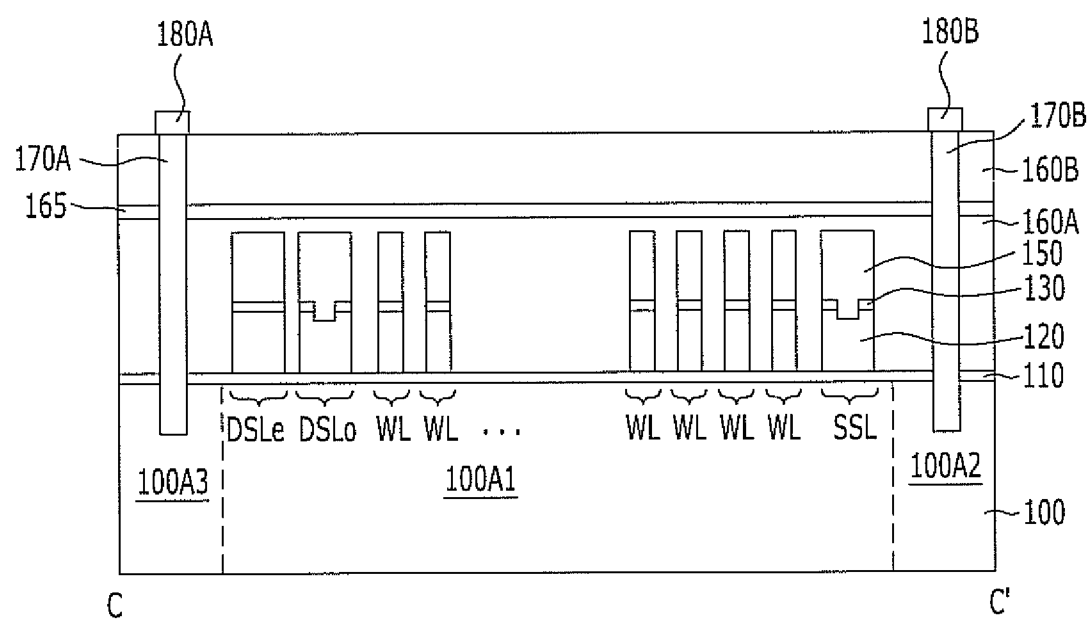

Referring to FIGS. 7A and 7B, a first interlayer dielectric layer 160A, a capping layer 165 and a second interlayer dielectric layer 160B are sequentially formed to cover the resultant structure of FIGS. 6A and 6B. The first and second interlayer dielectric layers 160A and 160B may include an oxide layer. The capping layer 165 interposed between the first and second interlayer dielectric layers 160A and 160B may include a nitride layer.

Next, by selectively etching the stack structure of the first interlayer dielectric layer 160A, the capping layer 165 and the second interlayer dielectric layer 1608, first contact holes CH1 for exposing portions of the third regions 100A3 and second contact holes CH2 for exposing portions of the second regions 100A2 are defined in the stack structure.

Referring to FIGS. 8A and 8B, by filling a conductive substance, such as a metal, in the first and second contact holes CH1 and CH2, first and second contacts 170A and 170B are formed. The first and second contacts 170A and 170B may be formed in such a manner that the conductive substance is deposited on the resultant structure including the first and second contact holes CH1 and CH2 and a planarization process such as CMP (chemical mechanical polishing) is conducted.

As described above, the first and second contact holes CH1 and CH2 are defined to expose the portions of the third and second regions 100A3 and 100A2, and the drain and source regions are formed in the third and second regions 100A3 and 100A2. Therefore, the first contacts 170A may be drain contacts which are connected with the drain regions of the third regions 100A3, and the second contacts 1708 may be source contacts which are connected with the source regions of the second regions 100A2.

In succession, by depositing a conductive substance, such as a metal, on the resultant structure including the first and second contacts 170A and 170B and patterning the conductive substance, first wiring lines 180A, which are disposed on the first contacts 170A and extend in the first direction, and second wiring lines 180B, which are disposed on the second contacts 170B and extend in the first direction, are formed. The first wiring lines 180A may be bit lines which are connected with the drain contacts, and the second wiring lines 180B may be source lines which are connected with the source contacts.

The nonvolatile memory device will be described with reference to FIGS. 8A and 8B.

Referring to FIGS. 8A and 8B, the nonvolatile memory device in accordance with the embodiment of the present invention includes the substrate 100 which has the active region 100A defined by the isolation layers 105, the pair of drain selection lines DSLe and DSLo, the word lines WL and the source selection line SSL, which are disposed over the substrate 100 and extend in the second direction to across the active region 100A, the stack structure of the first interlayer dielectric layer 160A, the capping layer 165, and the second interlayer dielectric layer 160B, which cover the pair of drain selection lines DSLe and DSLo, the word lines WL, and the source selection line SSL, the first and second contacts 170A and 170B which pass through the stack structure and are connected with portions of the active region 100A, for example, the drain regions and the source regions, and the first and second wiring lines 180A and 180B which are disposed over the stack structure to be respectively connected with the first and second contacts 170A and 170B and extend in the first direction.

It was described that the active region 100A includes the first to third regions 100A1, 100A2, and 100A3 and the first regions 100A1 corresponding to between the second and third regions 100A2 and 100A3 serve as the unit string regions.

In one unit string region, the first drain selection transistor DST1, the second drain selection transistor DST2, the plurality of memory transistors MT, and the source selection transistor SST are disposed by being connected in series, and in another unit string region adjacent to the one unit string region, the second drain selection transistor DST2, the first drain selection transistor DST1, the plurality of memory transistors MT, and the source selection transistor SST are disposed by being connected in series. Namely, in strings which are adjacent to each other, the positions of the first and second drain selection transistors DST1 and DST2 are reversed.

As described above, the first drain selection transistors DST1 and the memory transistors MT have the structure in which the tunnel dielectric layer 110, the first conductive layer 120, the intergate dielectric layer 130 and the second conductive layer 150 are stacked. Also, the second drain selection transistors DST2 and the source selection transistors SST have the structure in which the tunnel dielectric layer 110, the first conductive layer 120, the intergate dielectric layer 130 and the second conductive layer 150 are stacked and at least portions of the intergate dielectric layer 130 are removed such that the first conductive layer 120 and the second conductive layer 150 are electrically connected with each other.

The second conductive layer 150 of the first drain selection transistors DST1 and the second drain selection transistors DST2, which are alternately disposed in the respective unit string regions, extends in the second direction and constitutes the even drain selection line DSLe. The second conductive layer 150 of the second drain selection transistors DST2 and the first drain selection transistors DST1, which are alternately disposed in the respective unit string regions, extends in the second direction and constitutes the odd drain selection line DSLo. The second conductive layer 150 of the memory transistors MT, which are disposed in the respective unit string regions, extend in the second direction and constitutes the word lines WL. The second conductive layer 150 of the source selection transistors SST, which are disposed in the respective unit string regions, extend in the second direction and constitutes the source selection line SSL.

The drain regions are formed in portions of the active region 100A on one side of the drain selection lines DSLe and DSLo, in particular, the third regions 100A3, and the source regions are formed in portions of the active region 100A on one side of the source selection line SSL, in particular, the second regions 100A2.

The first and second contacts 170A and 170B may serve as drain contacts which are connected with the drain regions of the third regions 100A3 and source contacts which are connected with the source regions of the second regions 100A2.

The first and second wiring lines 180A and 180B, which are respectively connected with the first and second contacts 170A and 170B and are arranged parallel to one another in the first direction, may serve as the bit lines and the source lines.

As is apparent from the above descriptions, in the nonvolatile memory device, the method for fabricating the same, and the method for operating the same according to the embodiments of the present invention, since bit lines and source lines are alternately disposed parallel to each other, a pair of strings share one bit line, and an adjacent pair of strings share one source line, the bit lines and the source lines may be formed on the same layer through the same processes. Accordingly, processes may be simplified. Further, since a common source line is not used, a read operation may be performed in such a way of sensing current flowing between a bit line on one end of a string and a source line on the other end of the string. Therefore, sensing noise may be reduced in the read operation.

The nonvolatile memory device, the method for fabricating the same, and the method for operating the same according to the embodiments of the present invention may simplify fabrication processes and increase operational properties.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:

a substrate having an active region defined by isolation layers and including a plurality of first regions which extend in one direction and second and third regions which are disposed alternately between the first regions to connect the first regions with one another;

a source selection line, word lines, and first and second drain selection lines disposed over the substrate and extending to cross the first regions between the second and third regions;

first and second contacts disposed over the second and third regions, respectively; and first and second wiring lines respectively connected with the first and second contacts and extending parallel to one another, wherein each of the first and second drain selection lines includes a stack structure of a tunnel dielectric layer, a floating gate, an intergate dielectric layer, and a control gate, and wherein the first drain selection line has portions of the intergate dielectric layer removed at intersections with odd-numbered first regions among the first regions, and the second drain selection line has portions of the intergate dielectric layer removed at intersections with even-numbered first regions among the first regions.

2. The nonvolatile memory device of claim 1, wherein the source selection line includes a stack structure of a tunnel dielectric layer, a floating gate, an intergate dielectric layer, and a control gate, and portions of the intergate dielectric layer are removed, and wherein each of the word lines includes a stack structure of a tunnel dielectric layer, a floating gate, an intergate dielectric layer, and a control gate.

3. The nonvolatile memory device of claim 1, wherein the second regions are disposed on a side of the source selection line and the third regions are disposed on a side of the drain selection lines, wherein source and drain regions are respectively disposed in the second and third regions, and wherein the first wiring lines are bit lines and the second wiring lines are source lines.

4. A method for fabricating a nonvolatile memory device, comprising:

forming isolation layers in a substrate to define an active region including a plurality of first regions which extend in one direction and second and third regions which are disposed alternately between the first regions to connect the first regions with one another;

forming a source selection line, word lines, and first and second drain selection lines over the substrate to extend while crossing the first regions between the second and third regions;

forming a dielectric layer which covers the source selection line, the word lines, and the first and second drain selection lines;

forming first and second contacts in the dielectric layer to be respectively connected with the second and third regions; and forming first and second wiring lines over the dielectric layer to be respectively connected with the first and second contacts and extend parallel to one another, wherein each of the first and second drain selection lines includes a stack structure of a tunnel dielectric layer, a floating gate, an intergate dielectric layer, and a control gate, and wherein the first drain selection line has portions of the intergate dielectric layer removed at intersections with odd-numbered first regions among the first regions, and the second drain selection line has portions of the intergate dielectric layer removed at intersections with even-numbered first regions among the first regions.

5. The method of claim 4, wherein the forming of the source selection line, the word lines and the first and second drain selection lines comprises:

forming sequentially the tunnel dielectric layer, a conductive layer for the floating gates, and the intergate dielectric layer over the substrate;

removing the portions of the intergate dielectric layer, wherein the portions of the intergate dielectric layer include portions of the intergate dielectric layer that overlap with the odd-numbered first regions among the first regions, portions of the intergate dielectric layer that overlap with the even-numbered first regions among the first regions, and portions of the intergate dielectric layer that overlap with the source selection line; and forming a conductive layer for the control gates over a resultant structure form which the portions of the intergate dielectric layer are removed.

6. The method of claim 4, further comprising, after the forming of the source selection line, the word lines, and the first and second drain selection lines, performing a source/drain ion implantation process to form source regions in the second regions which are disposed on a side of the source selection line and drain regions in the third regions which are disposed on a side of the first and second drain selection lines.

* * * * *